US006787881B2

(12) United States Patent
Letor et al.

(10) Patent No.: US 6,787,881 B2
(45) Date of Patent: Sep. 7, 2004

(54) INTEGRATED POWER DEVICE WITH IMPROVED EFFICIENCY AND REDUCED OVERALL DIMENSIONS

(75) Inventors: Romeo Letor, Mascalucia (IT); Antonino Torres, Palermo (IT); Leonardo Fragapane, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 24 days.

(21) Appl. No.: 10/038,753

(22) Filed: Jan. 4, 2002

(65) Prior Publication Data

US 2002/0117732 A1 Aug. 29, 2002

(30) Foreign Application Priority Data

Aug. 1, 2001 (EP) .............................. 01830004

(51) Int. Cl.[7] .......................... H01L 25/16; H01L 27/02
(52) U.S. Cl. ....................... 257/577; 257/133; 257/135; 257/140; 257/146
(58) Field of Search ................................ 257/133, 135, 257/140, 146, 194, 341–342, 577, 762

(56) References Cited

U.S. PATENT DOCUMENTS 5,942,797 A    8/1999  Terasawa ..................... 257/723

6,055,148 A  *  4/2000  Grover et al. .............. 257/762

FOREIGN PATENT DOCUMENTS

| EP | 0 545 488 A1 | | 6/1993 |
|---|---|---|---|
| EP | 0 703 620 A1 | | 3/1996 |
| EP | 1 028 468 A1 | | 8/2000 |
| EP | 1120565 A | * | 1/2001 |
| WO | WO 99/04433 | | 1/1999 |

* cited by examiner

Primary Examiner—Minhloan Tran
Assistant Examiner—Thomas L Dickey
(74) Attorney, Agent, or Firm—Lisa K. Jorgenson; E. Russell Tarleton; Seed IP Law Group PLLC (57) ABSTRACT

An integrated power device having a power transistor made up of a first diode and a second diode that are connected together in series between a collector region and emitter-contact region of the power transistor to define a common intermediate node, a control circuit including a high-voltage region bonded on the emitter-contact region (14) by means of an adhesive layer, and biasing circuit connected between the common intermediate node and the high-voltage region. The biasing circuit including a contact pad electrically connected to the common intermediate node, an electrical connection region that is in electrical contact with the high-voltage region (30), and a wire having a first end soldered on the contact pad and a second end soldered on said electrical connection region.

21 Claims, 4 Drawing Sheets

INTEGRATED POWER DEVICE WITH IMPROVED EFFICIENCY AND REDUCED OVERALL DIMENSIONS

BACKGROUND OF THE INVENTION

1. Field of the Invention

The present invention refers to an integrated power device, and more particularly to an IGBT with control circuit having improved efficiency and reduced overall dimensions.

2. Description of the Related Art

As is known, power devices are used in all applications that require handling of high voltages and currents.

Figure 1:
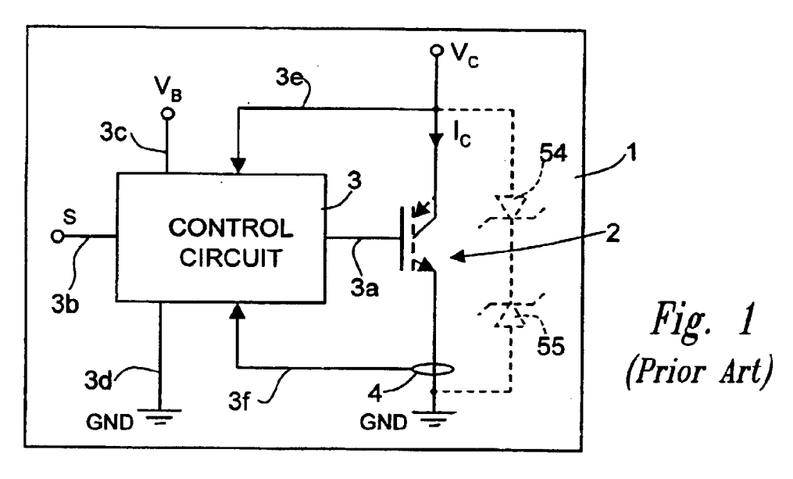
FIG. 1 shows a simplified diagram of an integrated power device.

For example, FIG. 1 shows an integrated power device 1 comprising a power transistor 2, built using an insulated-gate bipolar transistor (IGBT), and a control circuit, which may, for example, be made as described in the European patent application No. 00830051.9 filed on Jan. 27, 2000 in the name of the present applicant. More specifically, the power transistor 2 has a collector terminal on which a high collector voltage Vc (for example 300 to 400 V) is present, an emitter terminal connected to a ground line GND set at a ground voltage $V_{GND}$, and a control terminal connected to an output terminal 3a of the control circuit 3.

In turn, the control circuit 3 comprises an input terminal 3b for receiving a driving signal S, a supply terminal 3c set at a supply voltage VB (for example, of from 6 to 24 V), a ground terminal 3d connected to the ground line GND, a sensing terminal 3e connected to the collector terminal of the power transistor 2, and a feedback terminal 3f connected to the emitter terminal of the power transistor 2 via a voltage-to-current transducer 4.

The control circuit 3 receives the driving signal S and controls turning-on and turning-off of the integrated power device 1. In addition, it carries out a control on the value of the collector voltage Vc, detected by the sensing terminal 3e, for example by blocking the collector voltage Vc at a value programmed according to the operating conditions of the integrated power device 1, or else by stabilizing the oscillations of the collector voltage Vc during transients, or yet again by controlling the value dVc/dt. The control circuit 3 also controls the value of the current Ic flowing in the power transistor 2. The current Ic is detected by the voltage-to-current transducer 4, which supplies it to the control circuit 3 via the feedback terminal 3f. In this case, the control circuit 3 carries out a control on the current Ic, for example by controlling the value dIc/dt, or else by preventing the current Ic from exceeding a maximum value beyond which the integrated power device 1 may be subject to failure.

At present, there exist two possible solutions for assembling the integrated power device 1 described above.

Figure 2:
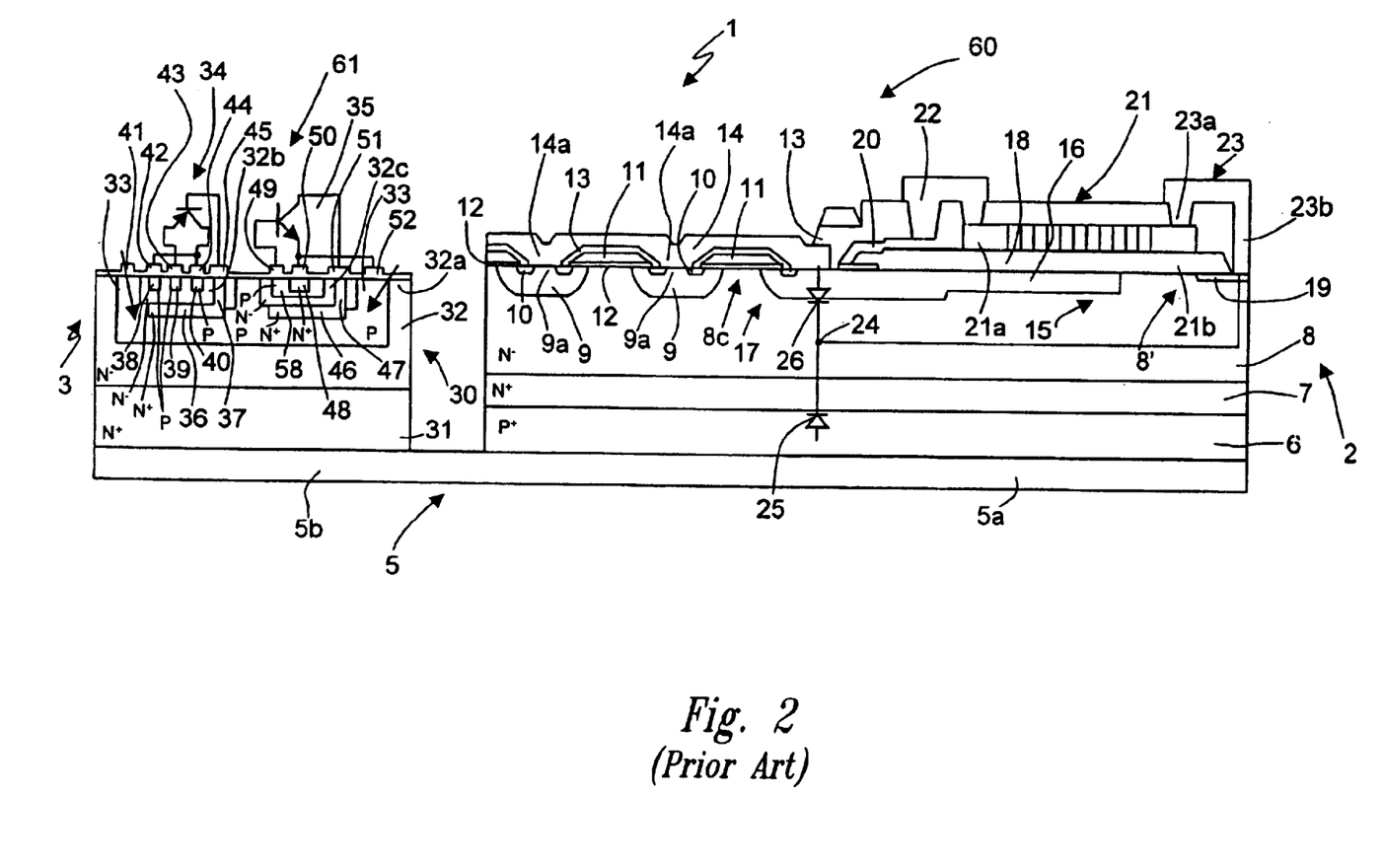
FIG. 2 shows a cross section of the integrated power device.

In a first solution (chip-to-chip solution), shown in FIG. 2, a first chip 60 and a second chip 61, which respectively integrate the power transistor 2 and the control circuit 3 (of which FIG. 2 shows only one portion), are soldered on one and the same copper plate 5. In this first solution, the control circuit 3 is made using an M1-type technology, which enables integration, in a high-voltage region (i.e., one able to withstand high voltages, for example 500 V), of components operating at low voltages (for example, 40 V).

In greater detail, the first chip 60 comprises a first substrate 6, of the P type, soldered on a first portion 5a of the copper plate 5 and defining a collector region of the power transistor 2. A first epitaxial layer 7, of the N⁺ type, is grown on top of the first substrate 6, and a second epitaxial layer 8, of the N⁻ type, and having a surface 8a, is grown on top of the first epitaxial layer 7. Body regions 9, of the P⁺ type, are housed in the second epitaxial layer 8, are set facing the surface 8a, and in turn house emitter regions 10, of the N⁺ type, set apart from one another by means of respective portions 9a of the body regions 9.

Polysilicon gate regions are set between pairs of body regions 9, on top of the surface 8a, and are electrically insulated from the latter by a gate-oxide layer 12. A thick oxide layer 13 envelops the gate regions 11 and separates them electrically from a metal emitter-contact region 14, which extends on top of the chip 60 and is in electrical contact with the emitter regions 10 and with the portions 9a of the body region 9 by means of contact portions 14a.

Figure 3:
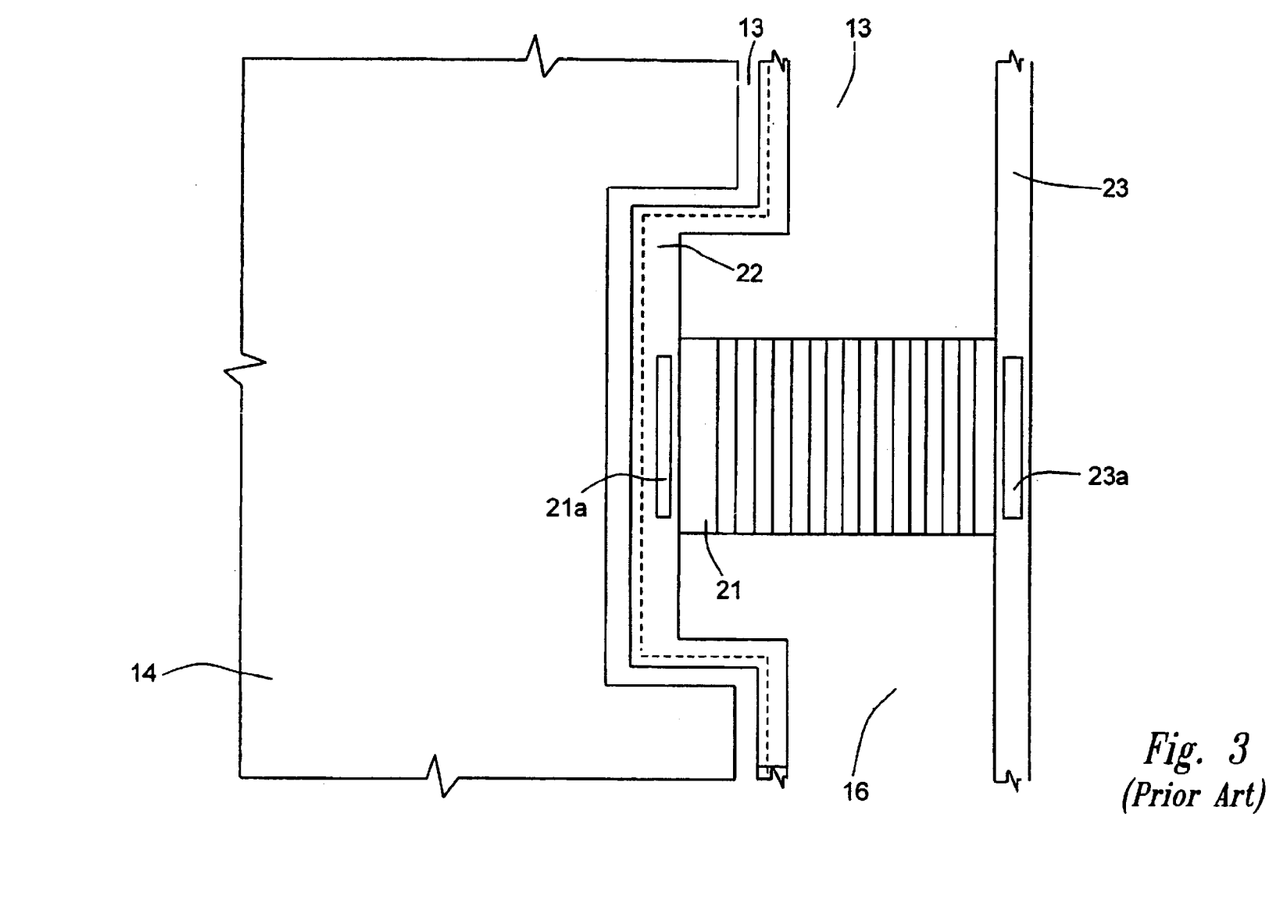
FIG. 3 shows a plan view of a power portion of the integrated power device.

The second epitaxial layer 8 also houses an edge structure 15 of the power transistor 2 comprising a first annular region 16, a second annular region 19, and an equipotential portion 8' belonging to the second epitaxial layer 8 and facing the first annular region 16 and the second annular region 19. The first annular region 16, of the P⁻ type, completely surrounds the area in which the body regions 9 are formed (active area 17) and is overlaid by a thick field-oxide layer 18. The second annular region 19, of the N⁺ type, surrounds the first annular region 16 externally (FIG. 3) and forms a channel stopper.

A field-plate region 20 extends on top of the active area 17 and is electrically insulated from the surface 8a of the second epitaxial layer 8 by the gate-oxide layer 12. A Zener diode 21 extends in part over the field-oxide layer 18 adjacent to the field-plate region 20. The field-plate region 20 and the Zener diode 21 are formed starting from one and the same polycrystalline-silicon layer.

The Zener diode 21 has a first end 21a and a second end 21b. The first end 21a is in electrical contact with a metal gate-contact region 22, which is set outside the active area 17 (FIG. 3), whilst the second end 21b is in electrical contact with a first contact portion 23a of a metallization region 23. The metallization region 23 has a second contact portion 23b which is in electrical contact with the equipotential portion 8', as schematically represented in FIG. 2, via an intermediate node 24 connected to the collector region 6 through a first diode 25, and to the metal emitter-contact region 14 through a second diode 26.

In particular, the first diode 25 has a cathode region defined by the first epitaxial layer 7 and an anode region defined by the collector region 6, whilst the second diode 26 has an anode region defined by the body region 9 and a cathode region defined by the epitaxial layer 8. The first diode 25 and the second diode 26 are connected together in antiseries via the intermediate node 24.

The second chip 61 comprises a high-voltage region 30 which is bonded on top of a second portion 5b of the copper plate 5, adjacent to the first portion 5a. The high-voltage region 30 is electrically connected to the collector region 6 of the power transistor 2 by means of the copper plate 5 and is formed by a second substrate 31, of the N⁺ type, directly bonded on the second portion 5b of the copper plate 5, and a third epitaxial layer 32, of the N⁻ type, grown on top of the second substrate 31 and having a surface 32a. The third epitaxial layer 32 houses an insulation region 33, of the P type, delimiting a first portion 32b and a second portion 32c of the third epitaxial layer 32, in which a first bipolar transistor 34, of the PNP type, and a second bipolar transistor, of the NPN type, which operate at low voltage, are respectively made.

More specifically, the first bipolar transistor 34 comprises a buried base region 36, of the N⁺ type, formed on top of the isolation region 33 and extending in part into the latter, and a deep base region 37, also of the N$^+$ type, which extends from the surface 32a of the third epitaxial layer 32 as far as the buried base region 36 so as to connect the latter electrically to the surface 32a itself. Above the buried base region 36 and at a distance from the latter are a first surface region 38, a second surface region 39, and a third surface region 40, all of the P type. The first surface region 38 and the third surface region 40 define an emitter region of the first bipolar transistor 35, whilst the second surface region 39 defines a collector region. On top of the surface 32a are a first metal region 41, a second metal region 42, a third metal region 43, a fourth metal region 44, and a fifth metal region 45, which are in electrical contact, respectively, with the first isolation region 33, the first surface region 38, the second surface region 39, the third surface region 40, and the deep base region 37. The second metal region 42 and the fourth metal region 44 together define an emitter-contact region of the first bipolar transistor 34; the third metal region 42 defines a collector-contact region of the first bipolar transistor 34; and the fifth metal region 45 defines a base-contact region.

In turn, the second bipolar transistor 35 comprises a buried collector region 46, of the N$^+$ type, formed on top of the isolation region 33 and extending in part into the latter, and a deep collector region 47, also of the N$^+$ type, which extends from the surface 32a of the third epitaxial layer 32 as far as the buried collector region 46 so as to connect the latter electrically to the surface 32a itself. Above the buried collector region 46 and at a distance from the latter is a base region 58, of the P type, housing a surface emitter region 49, of the N$^+$ type. On top of the surface 32a are a sixth metal region 49, a seventh metal region 50, an eighth metal region 51, and a ninth metal region 52, which set in electrical contact, respectively, the base region 42, the surface emitter region 48, the deep collector region 46, and the insulation region 33. The sixth metal region 49 defines a base-contact region of the second bipolar transistor 35; the seventh metal region 50 defines an emitter-contact region of the second bipolar transistor 35; and the eighth metal region 51 defines a collector-contact region.

Although the chip-to-chip solution described above is advantageous from various points of view, it presents, however, some drawbacks when the collector terminal of the power transistor 2 is connected to the terminal of a primary winding of an ignition coil. In these conditions, in fact, the ignition coil, after storing the amount of energy necessary for producing an ignition spark, returns part of this energy (discharge phase), generating on its own primary-winding terminal, and hence on the collector terminal of the power transistor 2, a voltage which is negative with respect to the ground voltage $V_{GND}$. This negative voltage, via the copper plate 5, is applied to the high-voltage region 30. Consequently, when the value of the negative voltage reaches the maximum value of the reverse voltage of insulation of the control circuit 3, a high current is injected into the high-voltage region 30. This current may prove destructive for the control circuit itself.

At present, in order to absorb the energy returned by the ignition coil and prevent destruction of the control circuit 3, a first protection diode 54 and a second protection diode 55 (shown in FIG. 1 by a dashed line) are connected together in antiseries between the collector terminal of the power transistor 2 and the emitter terminal. However, the use of these external components involves an increase in the area occupied by the integrated power device 1 and in the costs for fabrication of said device.

In order to overcome this problem, a second known solution (chip-on-chip solution) envisages implementation of the control circuit 3 using BCD or CMOS technologies, which employ substrates operating at low voltages (for example, 40 V); next, the control circuit 3 is bonded on the metal emitter-contact region 14 of the power transistor 2.

In this case, the control circuit 3 is protected from the negative voltage peaks to which the collector terminal of the power transistor 2 is subject, since it is completely insulated from the latter. In these conditions, however, the control circuit 3 is not able to perform control of the collector voltage Vc, which proves of fundamental importance when the integrated power device 1 is used for driving an ignition coil.

BRIEF SUMMARY OF THE INVENTION

The disclosed embodiments of the present invention are directed to an integrated power device with improved efficiency and reduced overall dimensions, that includes a power component, ideally an insulated gate bipolar transistor, having a first high-voltage region, a low-voltage region, a first unidirectional element and a second unidirectional element connected together between the first high-voltage region and the low-voltage region, the first and second unidirectional elements defining a common intermediate node; a biasing circuit connected between the common intermediate node and the second high-voltage region; and a control circuit that includes a high-voltage region.

In accordance with another aspect of the foregoing embodiment, the biasing circuit includes a contact pad electrically connected to the common intermediate node, an electrical connection region formed on the second high-voltage region, and an electrical connection line having a first end connected to the contact pad and a second end connected to the second electrical connection region.

In accordance with another aspect of the foregoing embodiment, the power component includes an edge structure, and the contact pad is set on top of the edge structure, with the edge structure ideally being formed of an equipotential annular region surrounding the power component, and the contact pad is set on top of the equipotential annular region.

In accordance with another embodiment of the present invention, the power component is formed on a first chip and the control circuit is formed on a second chip that is set on top of and affixed to the first chip, the second chip including a substrate fixed to the low-voltage region by means of an adhesive layer.

BRIEF DESCRIPTION OF THE SEVERAL VIEWS OF THE DRAWING(S)

The characteristics and advantages of the integrated power device formed in accordance with the invention will emerge from the ensuing description of a representative of embodiment, which is given to provide a non-limiting illustration, with reference to the attached drawings, in which.

DETAILED DESCRIPTION OF THE INVENTION

Figures 4, 6:
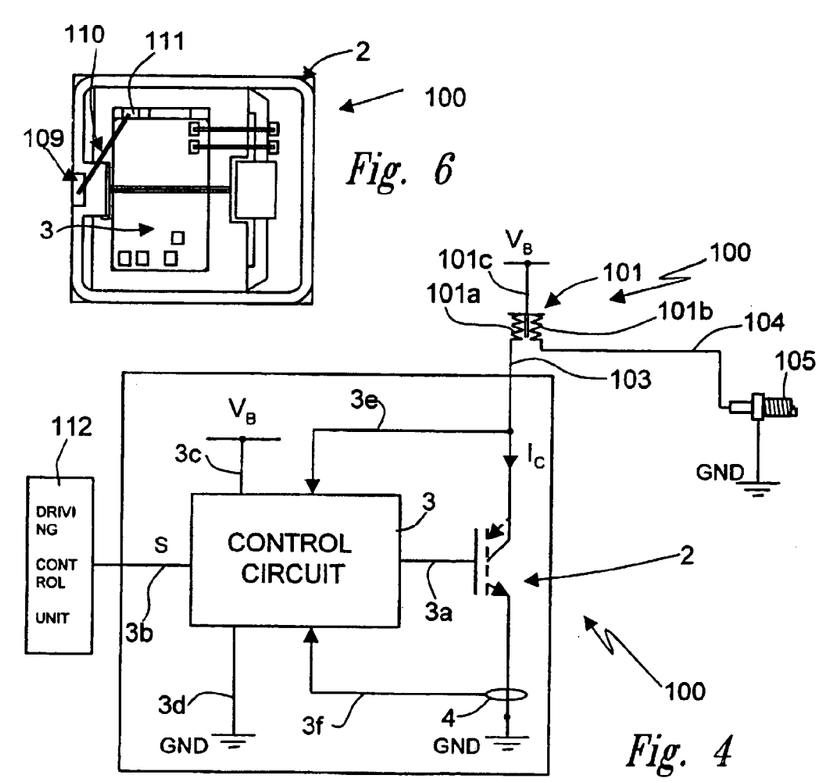
FIG. 4 shows an integrated power device connected to an ignition coil.
FIG. 6 shows a plan view of the integrated power device of FIG. 5.

FIG. 4 shows an integrated power device 100 connected to an ignition coil 101. To the extent the integrated power device 100 is structurally the same as the integrated power device 1 of FIG. 1, the same reference numbers have been used, and the device will not be described any further. The ignition coil 101 is made up of a primary winding 101a and a secondary winding 101b. A first terminal 101c of the primary winding 101a and secondary winding 101b is connected to a supply line 102 set at a supply voltage $V_B$; a second terminal 103 of the primary winding 101a is connected to the collector terminal of the power transistor 2; and a second terminal 104 of the secondary winding 101b is connected to a spark plug 105. In addition, the input terminal 3b of the driving circuit 3 is connected to a driving control unit 112 comprising known circuits that generate the driving signal S.

Figure 5:
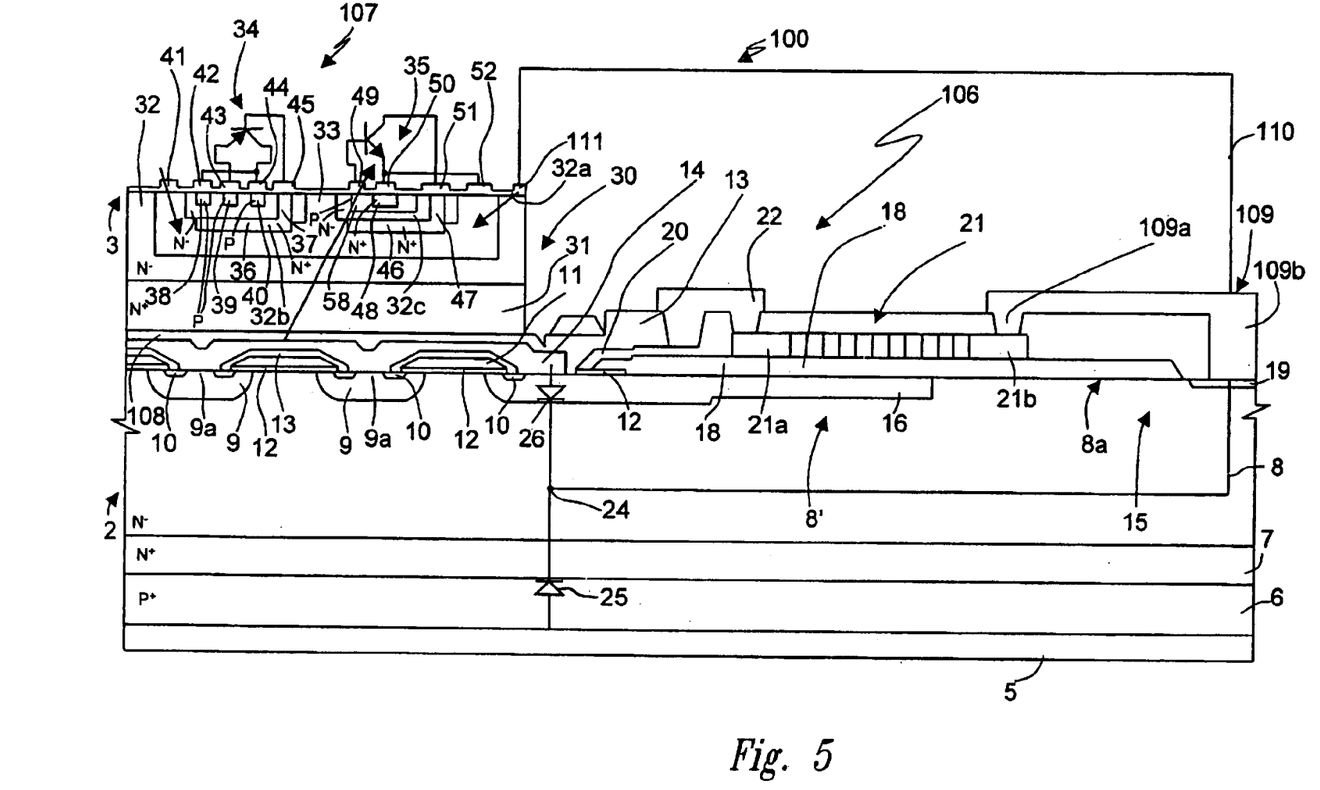
FIG. 5 shows a cross section of an integrated power device made according to the present invention.

As is shown in FIG. 5, the integrated power device 100 is made up of a first chip 106 integrating the power transistor 2 and a second chip 107 integrating the control circuit 3. To the extent the first chip 106 and the second chip 107 are structurally the same as the first chip 60 and second chip 61 of FIG. 2, the same reference numbers have been used, and the chips will not be further described herein. In particular, the second chip 107 is implemented, as in the case of the second chip 61, using a high-voltage technology, for example M1 technology.

According to the present invention, the integrated power device 100 is assembled using the chip-on-chip solution, i.e., fixing the second chip 107 on top of the first chip 106. In particular, the second substrate 31 of the control circuit 3 is bonded on the metal emitter-contact region 14 of the power transistor 2 by means of an adhesive layer 108 which also creates an insulation between these two regions. In addition, formed on the surface 8a of the first chip 106, on top of the second annular region 19 (which replaces the metallization region 23), is a contact pad 109 having a first contact portion 109a which is in electrical contact with the second end 21b of the Zener diode 21, and a second contact portion 109b which is in electrical contact with the equipotential portion 8' schematically represented by means of the intermediate node 24 that is connected to the collector region 6 of the power transistor 2 through the first diode 25 and to the metal emitter-contact region 14 through the second diode 26. The contact pad 109 is soldered by means of a wire 110 to an electrical connection region 111 formed on the surface 32a of the second chip 107 (see FIG. 6) on top of the high-voltage region 30. In this way, an electrical connection is obtained between the high-voltage region 30 of the control circuit 3 and the collector region 6 of the power transistor 2 (which in known chip-on-chip solutions was not present), thus enabling control of the collector voltage Vc applied to the collector region 6 by the control circuit 3.

Operation of the integrated power device 100 is described in what follows with reference to FIGS. 4 and 5. When the collector voltage Vc assumes positive values (charging phase of the ignition coil 101), the first diode 25 is forward-biased, whilst the second diode 26 is reverse-biased because on the emitter-contact region 14 an emitter voltage Ve is present equal to the ground voltage $V_{GND}$, namely, 0 V. In these conditions, there is present on the intermediate node 24 and hence on the contact pad 109 a first biasing voltage Vp1 equal to:

$$Vp1=Vc-Vbe1$$

where Vbe1 is the voltage present across the first diode 25. The first biasing voltage Vp1 is applied to the electrical connection region 111, and hence to the high-voltage region 30 of the control circuit 3, via the wire 110.

Instead, when the collector voltage Vc assumes negative values (discharge phase of the ignition coil 101), the second diode 26 is forward-biased and connects the intermediate node 24 to the emitter-contact region 14 of the power transistor 2. In these conditions, there is present, on the intermediate node 24, and hence on the contact pad 109, a second biasing voltage Vp2 equal to:

$$Vp2=Ve-Vbe2$$

$$Vp2=Vc-Vbe2$$

where Vbe2 is the voltage present across the second diode 26, and Ve=$V_{GND}$=0 V In addition, the first diode 25 is reverse-biased thus insulating the intermediate node 24 from the collector region 6. In these conditions, the collector voltage Vc may assume even high negative values without causing flow of a high current in the control circuit 3, thus preventing destruction of the latter as occurs, instead, in known solutions, in so far as the collector region 6 and the high-voltage region 30 are completely insulated.

In addition, if the collector voltage Vc reaches a negative value equal to the breakdown voltage of the first diode 25, the latter operates as a Zener diode which is able to absorb a high energy compatible with the working conditions required in the applications of the integrated power device 100.

The advantages that may be obtained with the integrated power device 100 are described in what follows. In the first place, the integrated power device 100 according to the invention is particularly suited for being used in electronic ignition systems due to its capacity for carrying out efficient control of the collector voltage Vc (in fact, the control circuit 3 can perform control of the collector voltage Vc without being subject to the negative-voltage peaks of the latter), and due to its small overall dimensions (in so far as it does not require any external components to absorb the energy returned by the ignition coil 101 during the discharge phase of the latter). In existing electronic ignition systems, small overall dimensions prove particularly important in that the ignition coil and the integrated power device are mounted directly on the spark plug.

Finally, it is clear that numerous modifications and variations may be made to the integrated power device described and illustrated herein, all falling within the scope of the inventive idea, as defined in the attached claims and the equivalents thereof.

For example, the control circuit 3 may be built using a high-voltage BCD technology.

What is claimed is:

1. An integrated power device comprising:
    a power component including a first high-voltage region, a low-voltage region, a first unidirectional element and a second unidirectional element connected together between said first high-voltage region and said low-voltage region, said first and said second unidirectional elements defining a common intermediate node;
    biasing means connected between said common intermediate node and a second high-voltage region and configured to connect the intermediate node directly to the second high-voltage region; and a control circuit including the second high-voltage region.

2. The device of claim 1 wherein said biasing means comprise:

a contact pad electrically connected to said common intermediate node;

an electrical connection region formed on said second high-voltage region; and an electrical connection line having a first end connected to said contact pad and a second end connected to said electrical connection region.

3. The device of claim 2 wherein said power component comprises an edge structure, and said contact pad is set on top of said edge structure.

4. The device of claim 3 wherein said edge structure comprises an equipotential annular region surrounding said power component, and in that said contact pad is set on top of said equipotential annular region.

5. The device of claim 2 wherein said electrical connection line comprises a wire.

6. The device of claim 1 wherein said first and said second unidirectional elements define a first diode and a second diode connected together in antiseries through said common intermediate node.

7. The device of claim 6 wherein said first diode has an anode region formed by said first high-voltage region, and a cathode region formed by a first epitaxial layer set on top of said first high-voltage region.

8. The device of claim 6 wherein said second diode has a cathode region formed by a second epitaxial layer (8) set on top of said first epitaxial layer, and an anode region formed by a body region of said power component, said body region housed in said second epitaxial layer beneath said low-voltage region.

9. The device of claim 1 wherein said power component is formed in a first chip, and said control circuit is formed in a second chip.

10. The device of claim 9 wherein said second chip is set on top of and is fixed to said first chip.

11. The device of claim 9 wherein said second chip comprises a substrate fixed to said low-voltage region by means of an adhesive layer.

12. The device of claim 11 wherein said adhesive layer is made of insulating material.

13. The device of claim 1 wherein said power component is an IGBT transistor, said high-voltage region is a collector region, and said low-voltage region is an emitter-contact region.

14. An integrated power device, comprising:

a power circuit comprising a first high-voltage region, a low-voltage region, first and second unidirectional elements connected together between the first high-voltage region and the low-voltage region to define a common intermediate node;

a biasing circuit connected between the common intermediate node and a second high-voltage region, the biasing circuit comprising a contact pad electrically connected to the common intermediate node;

an electrical contact region formed on the second high-voltage region;

an electrical connection line having a first end connected to the contact pad and a second end connected to the electrical contact region;

an edge structure formed in the power circuit and comprising an equipotential annular region surrounding the power circuit, the contact pad of the biasing circuit being set on top of the equipotential annular region; and a control circuit that includes the second high-voltage region.

15. An integrated power device, comprising:

a power device comprising a first high-voltage region and a low-voltage region;

a first diode and a second diode connected together in antiseries between the first high-voltage region and the low-voltage region to define a common intermediate node therebetween;

a biasing circuit connected between the common intermediate node and a second high-voltage region, the biasing circuit comprising a contact pad electrically connected to the common intermediate node;

an electrical contact region formed on the second high-voltage region;

an electrical connection line having a first end connected to the contact pad and a second end connected to the electrical contact region;

an edge structure formed in the power device and comprising an equipotential annular region surrounding the power device, the contact pad of the biasing circuit being set on top of the equipotential annular region; and a control circuit that includes the second high-voltage region.

16. An integrated power device, comprising:

a power device comprising a first high-voltage region and a low-voltage region;

a first diode and a second diode connected together in antiseries between the first high-voltage region and the low-voltage region to define a common intermediate node therebetween, the first diode comprising an anode region formed by the first high-voltage region and a cathode region formed by a first epitaxial layer set on top of the first high-voltage region, the second diode comprising a cathode region formed by a second epitaxial layer set on top of the first epitaxial layer, and an anode region formed by a body region of the power device, the body region housed in the second epitaxial layer beneath the low-voltage region;

a biasing circuit connected between the common intermediate node and a second high-voltage region, the biasing circuit comprising a contact pad electrically connected to the common intermediate node;

an electrical contact region formed on the second high-voltage region;

an electrical connection line having a first end connected to the contact pad and a second end connected to the second electrical region;

an edge structure formed in the power device and comprising an equipotential annular region surrounding the power device, the contact pad of the biasing circuit being set on top of the equipotential annular region; and a control circuit that includes the second high-voltage region.

17. An integrated power device, comprising:

a power component comprising a first high-voltage region, a low-voltage region, first and second unidirectional elements connected together between the first high-voltage region and the low-voltage region to define a common intermediate node;

a biasing circuit connected between the common intermediate node and a second high-voltage region, the biasing circuit comprising a contact pad electrically connected to the common intermediate node;

an electrical contact region formed on the second high-voltage region;

an electrical connection line having a first end connected to the contact pad and a second end connected to the electrical contact region;

an edge structure formed in the power component and comprising an equipotential annular region surrounding the power component, the contact pad of the biasing circuit being set on top of the equipotential annular region;

a control circuit that includes the second high-voltage region; and the power component formed on a first chip, and the control circuit formed on a second chip, wherein the second chip is set on top of and affixed to the first chip.

18. An integrated power device, comprising:

a power component comprising a first high-voltage region, a low-voltage region, first and second unidirectional elements connected together between the high-voltage region and the low-voltage region to define a common intermediate node;

a biasing circuit connected between the common intermediate node and a second high-voltage region, the biasing circuit comprising a contact pad electrically connected to the common intermediate node;

an electrical contact region formed on the second high-voltage region;

an electrical connection line having a first end connected to the contact pad and a second end connected to the electrical contact region;

an edge structure formed in the power component and comprising an equipotential annular region surrounding the power component, the contact pad of the biasing circuit being set on top of the equipotential annular region;

a control circuit that includes the second high-voltage region; and the power component formed on a first chip, and the control circuit formed on a second chip, wherein the second chip is set on top of and affixed to the first chip, the second chip comprising a substrate fixed to the low-voltage region by means of an adhesive layer.

19. An integrated power device, comprising:

a power component comprising a first high-voltage region, a low-voltage region, first and second unidirectional elements connected together between the first high-voltage region and the low-voltage region to define a common intermediate node;

a biasing circuit connected between the common intermediate node and a second high-voltage region, the biasing circuit comprising a contact pad electrically connected to the common intermediate node;

an electrical contact region formed on the second high-voltage region;

an electrical connection line having a first end connected to the contact pad and a second end connected to the electrical contact region;

an edge structure formed in the power component and comprising an equipotential annular region surrounding the power component, the contact pad of the biasing circuit being set on top of the equipotential annular region;

a control circuit that includes the second high-voltage region; and the power component comprising an IGBT transistor having a collector region that comprises the first high-voltage region and an emitter-contact region that comprises the low-voltage region, the IGBT transistor formed in a first chip, and the control circuit formed in a second chip that comprises a substrate fixed to the low-voltage region by means of an adhesive layer such that the second chip is set on top of and is affixed to the first chip, wherein the second chip is set on top of and affixed to the first chip, the second chip comprising a substrate fixed to the low-voltage region by means of an adhesive layer.

20. An integrated power device comprising:

a power component including a first high-voltage region, a low-voltage region, a first unidirectional element and a second unidirectional element connected together between said first high-voltage region and said low-voltage region, said first and said second unidirectional elements defining a common intermediate node; and biasing means connected between said common intermediate node and said second high-voltage region, the biasing means comprising a contact pad electrically connected to the common intermediate node, an electrical connection region formed on a second high-voltage region, and an electrical connection line having a first end connected to the contact pad and second end connected to the electrical connection region.

21. An integrated power device comprising:

a power component including a first high-voltage region, a low-voltage region, a first unidirectional element and a second unidirectional element connected together between said first high-voltage region and said low-voltage region, said first and said second unidirectional elements defining a common intermediate node, the power component formed in a first chip;

biasing means connected between said common intermediate node and a second high-voltage region; and a control circuit including the second high-voltage region, the control circuit formed in a second chip that is set on top of and fixed to the first chip, the second chip comprising a substrate fixed to the low-voltage region by means of an adhesive layer made of insulating material.

* * * * *

UNITED STATES PATENT AND TRADEMARK OFFICE
CERTIFICATE OF CORRECTION

PATENT NO. : 6,787,881 B2
DATED : September 7, 2004
INVENTOR(S) : Romeo Letor et al.

It is certified that error appears in the above-identified patent and that said Letters Patent is hereby corrected as shown below:

Title page,
Item [30], Foreign Application Priority Data, should read as -- January 8, 2001 --.

Column 9,
Lines 22 and 23, "the high-voltage region" should read as -- the first high-voltage region --.

Signed and Sealed this

Twenty-third Day of August, 2005

JON W. DUDAS
*Director of the United States Patent and Trademark Office*